(12) United States Patent
Kaya et al.

(10) Patent No.: US 6,646,925 B2
(45) Date of Patent: Nov. 11, 2003

(54) METHOD AND SYSTEM FOR DISCHARGING THE BIT LINES OF A MEMORY CELL ARRAY AFTER ERASE OPERATION

(75) Inventors: Cetin Kaya, Plano, TX (US); Stephen K. Heinrich-Barna, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/010,413

(22) Filed: Dec. 7, 2001

(65) Prior Publication Data

US 2002/0091893 A1 Jul. 11, 2002

Related U.S. Application Data

(60) Provisional application No. 60/256,774, filed on Dec. 19, 2000.

(51) Int. Cl.$^7$ ................................................. G11C 16/04
(52) U.S. Cl. .......................... 365/185.29; 365/185.33; 365/185.26; 365/185.27
(58) Field of Search ....................... 365/185.29, 185.27, 365/185.31, 185.33, 185.26

(56) References Cited

U.S. PATENT DOCUMENTS 5,907,506 A * 5/1999 Jinbo ..................... 365/185.29

* cited by examiner

*Primary Examiner*—Richard Elms
*Assistant Examiner*—Jung H. Hur
(74) *Attorney, Agent, or Firm*—Peter K. McLarty; W. James Brady, III; Frederick J. Telecky, Jr.

(57) ABSTRACT

A method for use in erasing data stored in a memory cell includes asserting a voltage differential across a tank region and a gate region of the memory cell, wherein the tank region has a first conductivity type and the tank region is located within a well region of a second conductivity type. The method also includes floating the voltage level of a source region and a drain region of the memory cell, wherein the source region and the drain region are located within the tank region and have the second conductivity type. The method additionally includes discharging a charge stored in the drain region by electrically connecting the source region to an electric potential lower than the potential of the drain region and electrically connecting the well region and the tank region to a potential lower than their existing potentials.

13 Claims, 4 Drawing Sheets

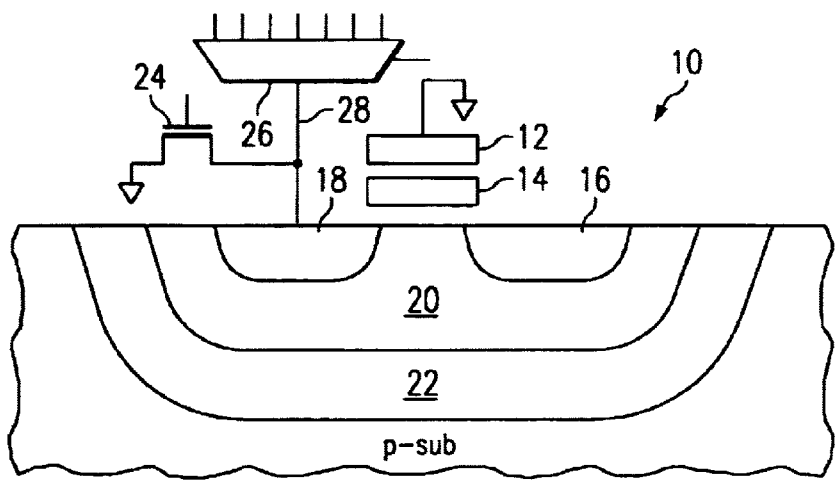
FIG. 1A (PRIOR ART)
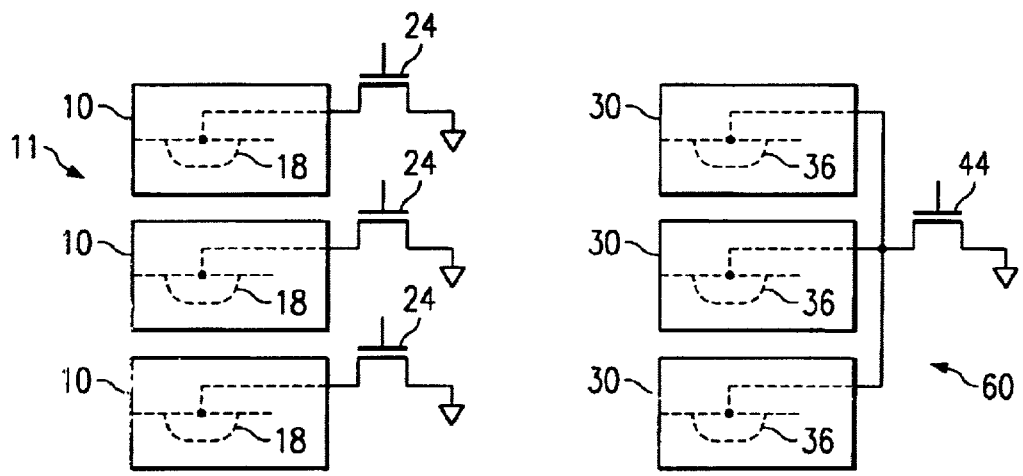
FIG. 1B (PRIOR ART)
FIG. 2B
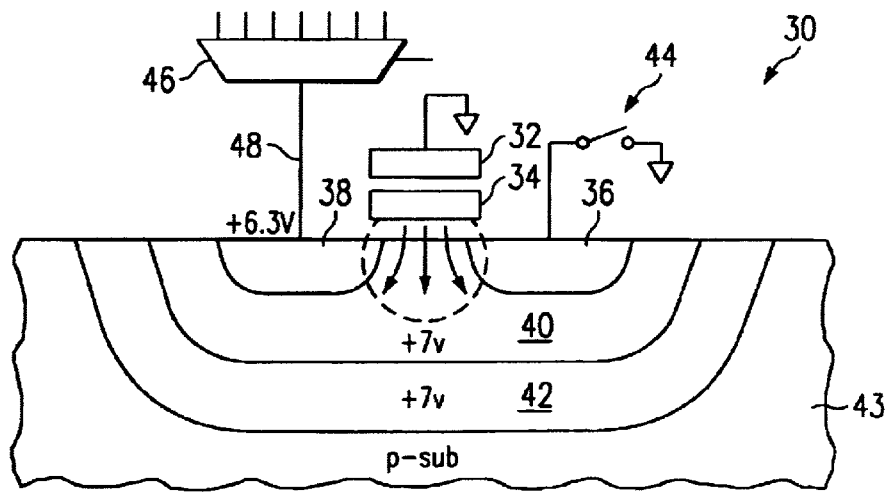
FIG. 2A

METHOD AND SYSTEM FOR DISCHARGING THE BIT LINES OF A MEMORY CELL ARRAY AFTER ERASE OPERATION

This application claims priority under 35 USC §119(e)(1) of provisional application Ser. No. 60/256,774, filed Dec. 19, 2000.

FIELD OF THE INVENTION

This invention relates generally to non-volatile memory devices and more particularly to a method and system for discharging the bit lines of a non-volatile memory after an erase operation.

BACKGROUND OF THE INVENTION

Non-volatile memory is used to store data in devices where data must be maintained when the device is not connected to a power supply. For example, non-volatile memory is used in personal computers to store the instructions for completing very basic tasks such as interfacing with a keyboard or accessing a disk drive. A common type of non-volatile memory is flash memory. Unlike many types of non-volatile memory, flash memory can be erased and rewritten.

To erase a flash memory cell, a large voltage is applied to the cell that erases the data stored in the cell. However, this process leaves an undesired charge on the bit line attached to the memory cell that must be eliminated. Previous attempts at solving this problem include attaching a discharge transistor to the bit line that is operable to create a connection to ground for discharging the bit line. A problem with this solution is that when a plurality of memory cells are configured as an array, the previous solution requires a separate transistor for each memory cell column. This results in memory cell arrays being unnecessarily large and, consequently, more expensive to produce.

SUMMARY OF THE INVENTION

Accordingly, a need has arisen for an improved method and system for discharging the charge remaining on the bit line of a memory cell after erasure. The present invention provides a system and method for discharging flash memory cell bit lines that addresses the shortcomings of prior systems and methods.

According to one embodiment of the invention, a method for use in erasing data stored in a memory cell includes asserting a voltage differential across a tank region and a gate region of the memory cell. The tank region has a first conductivity type and the tank region is located within a well region of a second conductivity type. The method also includes floating the voltage level of a source region and a drain region of the memory cell. The source region and the drain region are located within the tank region and have the second conductivity type. The method additionally includes discharging a charge stored in the drain region by electrically connecting the source region to an electric potential lower than the potential of the drain region and electrically connecting the well region and the tank region to a potential lower than their existing potentials.

According to another embodiment of the invention, a memory array includes a plurality of memory cells. Each memory cell includes a well region having a first conductivity type. The memory cell additionally includes a tank region located within the well region and having a second conductivity type. The memory cell also includes a source region located in the tank region. The source has the first conductivity type. The memory cell additionally includes a drain region located in the tank region. The drain region has the first conductivity type. The memory cell array also includes a switch connecting each source region to ground in a manner such that, when the switch is close, electrons will flow from the source region to the drain region.

Embodiments of the invention provide numerous technical advantages. For example, in one embodiment of the invention, a method is provided for discharging an entire memory cell array by means of one switch connected to a common source region of the memory array. Thus, a single transistor can be used to discharge each of the plurality of memory cells comprising the memory array. As a result, the silicon area of memory arrays can be reduced, leading to lower production costs.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which:

FIG. 1A is a schematic cross-sectional diagram showing the structure of a memory cell and associated structure for discharging a portion of the cell according to conventional techniques;

FIG. 1B is a block diagram showing how a plurality of the memory cells of FIG. 1A are configured to form a memory cell array;

FIG. 2A is a schematic cross-sectional diagram showing the structure of a memory cell in accordance with one embodiment of the present invention and the voltage levels of its components following an erase operation;

FIG. 2B is a block diagram showing how a plurality of the memory cells of FIG. 2A are configured to form a memory cell array;

DETAILED DESCRIPTION OF THE INVENTION

Figure 3A:
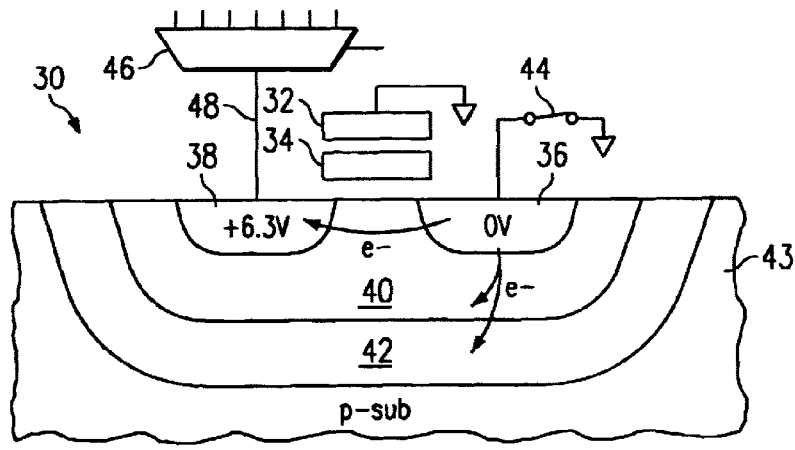
FIG. 3A is a schematic cross-sectional diagram showing the flow of electrons that results when the memory cell of FIG. 2A is discharged in accordance with one method of the present invention.

Embodiments of the present invention and its advantages are best understood by referring to FIGS. 1A through 5C of the drawings, like numerals being used for like and corresponding parts of the various drawings.

FIG. 1A is a schematic cross sectional diagram showing the structure of a memory cell 10 and a discharge transistor 24 for discharging a portion of memory cell 10 according to conventional techniques. Memory cell 10 comprises a select gate region 12, a floating gate region 14, a source region 16, a drain region 18, a tank region 20, a well region 22 and a substrate region 23. Also shown in FIG. 1A are a discharge transistor 24 connected to ground, a data multiplexor 26, and a bit line 28. After an erase operation on memory cell 10, a charge remains on bit line 28, which must be discharged. Discharge is accomplished in memory cell 10 by turning on discharge transistor 24, thereby creating an electrical connection between bit line 28 and ground. The remaining charge on bit line 28 subsequently discharges to ground.

FIG. 1B is a block diagram showing how a plurality of memory cells 10 are configured to form memory cell array 11. Each memory cell 10 requires a separate discharge transistor 24 for the discharge of its bit line 28. As a result, the conventional method of discharging results in a significant increase in the silicon area of memory cell array 11.

FIGS. 2A through 3D show one embodiment of the present invention and other drawings related to the operation of that embodiment. Because this embodiment does not require multiple discharge transistors, this embodiment offers substantial area savings over memory cells configured in accordance with conventional discharge methods. Furthermore, because the silicon area of a memory cell is a primary factor in the cost of manufacturing such memory cells, the present teachings offer a significant reduction in production costs.

FIG. 2A shows a schematic cross-sectional diagram of one embodiment of the present invention. Memory cell 30 comprises a select gate region 32, a floating gate region 34, a source region 36, a drain region 38, a tank region 40, a well region 42, and a substrate region 43. Also shown in FIG. 2A are a switch 44, a data multiplexor 46 and a bit line 48.

Tank region 40 is located within well region 42 and has the opposite conductivity type of well region 42. Drain region 38 and source region 36 are located within tank region 40 and have the opposite conductivity type of tank region 40. In this embodiment, drain region 38, source region 36 and well region 42 comprise silicon doped with negative charge carriers, or n-type silicon, and tank region 40 and substrate region 43 comprise silicon doped with positive charge carriers, or p-type silicon.

As described in more detail below, switch 44 is electrically connected to source region 36 to allow discharge of source region 36 after memory cell 30 has been erased. Switch 44 may be implemented by a transistor or other suitable electrical switch. Bit line 48 connects drain region 38 to data multiplexor 46, which serves as an output port for memory cell 30.

During erasure of memory cell 30 in this embodiment, a voltage level of seven volts is applied to well region 42 and tank region 40. This charges source region 36 and drain region 38 to 6.3v. A voltage of negative seven volts is applied to select gate 32. This application of voltages between well region 42 and select gate region 32 induces an electric field between floating gate region 34 and tank region 40. After the electrical erase, gate region 32 is then grounded, resulting in the voltages shown in FIG. 2A.

After this erase procedure a voltage level remains on drain region 38, which must be removed. According to the teachings of the invention and as described in greater detail below, the voltage level is discharged by completing a connection between ground and source region 36, tank region 40, well region 42, or any suitable combination thereof. In this embodiment, a transistor acting as a switch 44 completes the connection for a plurality of the memory cells 30 of the memory cell array 60. By contrast, prior art memory cell arrays require a separate discharge transistor attached to each bit line of the memory cell array. Thus, the advantages of the present invention include, but are not limited to, a reduction in the silicon area needed for individual memory cells 30 within memory cell array 60 and consequently a decrease in the cost of manufacturing memory cell array 60.

FIG. 2B is a block diagram showing how a plurality of memory cells 30 of FIG. 2A are configured to form a memory cell array 60. Unlike prior art memory cell array 11, memory cell array 60 requires only one switch 44 to discharge all bit lines 48 within memory cell array 60. Also, switch 44 does not have to be pitch-match to the array. This facilitates circuit design.

FIG. 3A is a schematic cross-sectional diagram showing the flow of electrons that results when the memory cell 30 is discharged in accordance with one method of the present invention. Switch 44 is closed so that source region 36 is electrically connected to ground. As a result, the voltage level of source region 36 decreases to 0 volts. Because drain region 38, tank region 40, and well region 42 now have greater voltages than source region 36, the electrons that are abundant in the n-type material of source region 36 are emitted to drain region 38, tank region 40, and well region 42.

Figure 3B:
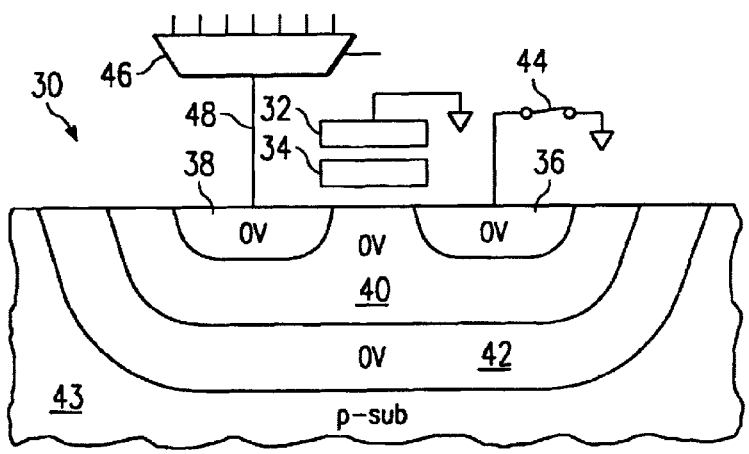
FIG. 3B is a schematic cross-sectional diagram showing the voltage levels of the components of the memory cell of FIG. 2A after the transfer of electrons shown in FIG. 3A.

FIG. 3B is a schematic cross-sectional diagram showing the voltage levels of the components of memory cell 30 after the transfer of electrons shown in FIG. 3A. The flow of electrons from source region 36 to drain region 38, tank region 40 and well region 42 decreases the voltage level of drain region 38, tank region 40, and well region 42 to 0 volts, thereby eliminating the charge that remained on bit line 48 as a result of the erase operation, as described in greater detail below in conjunction with FIG. 3C.

Figure 3C:
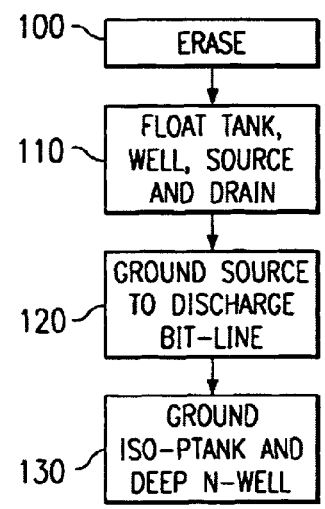
FIG. 3C is a flow chart showing steps involved in discharging the memory cell of FIG. 2A in accordance with the present invention.

FIG. 3C is a flow chart showing steps involved in discharging memory cell 30 in accordance with the present invention. Step 100 comprises an erase operation. Erasure of memory cell 30 is accomplished in this embodiment of the invention by applying a positive voltage differential across well region 42 and select gate region 32. Well region 42 and tank 40 are at the same potential. As discussed above, a charge remains on drain region 38, and consequently, on bit line 48 after the erase operation. Step 110 comprises floating tank region 40 and well region 42 during the erase step 100.

Source region 36 and drain region 38 are also floating. Step 120 comprises electrically connecting source region 36 to ground. Such a connection is accomplished in this embodiment by means of switch 44, which can be a transistor or other electrical switch. Step 120 is accomplished by closing switch 44, which connects source region 36 to ground and causes the remaining charge on bit line 48 to discharge as described above. Step 130 comprises electrically connecting tank region 40 and well region 42 to ground to discharge any remaining charge stored in tank region 40 or well region 42.

Figure 3D:
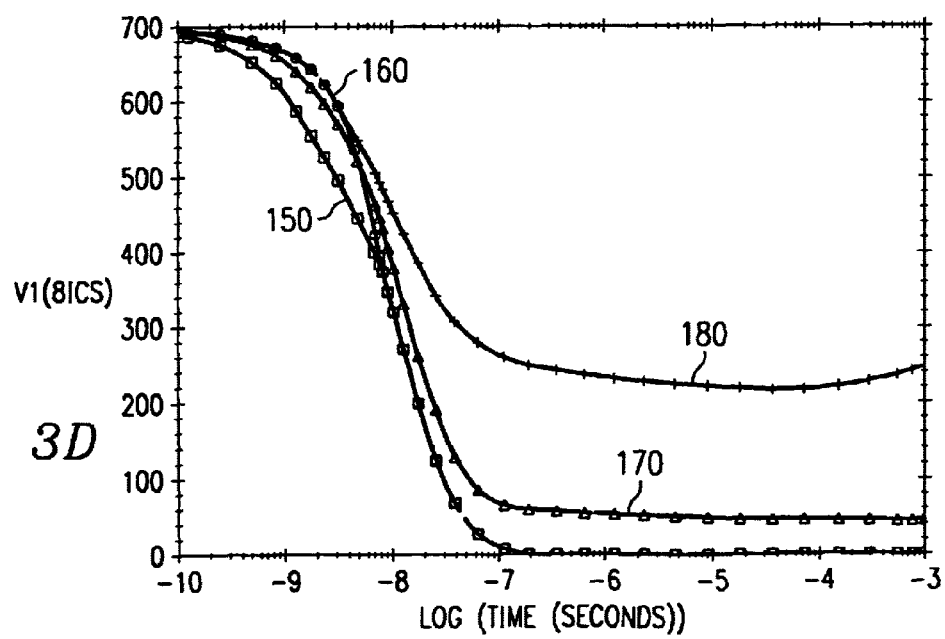
FIG. 3D is a graph showing the voltage versus time characteristics of components of the memory cell of FIG. 2A during discharge according to the teachings of the present invention.

FIG. 3D is a graph showing the voltage versus time characteristics of components of memory cell 30 when discharged according to the teachings of the present invention. Curve 150 shows the voltage level of source region 36 during discharge according to the method shown in FIG. 3A, while curve 160 shows the voltage level of drain region 38. Similarly, curve 170 and curve 180 show the voltage levels of tank region 40 and well region 42 respectively. As shown by FIG. 3D and particularly curve 160, discharging memory cell 30 in accordance with this embodiment of the present invention does successfully eliminate a substantial portion of the remaining charge on drain region 38 and consequently, on bit line 48.

Figure 4A:
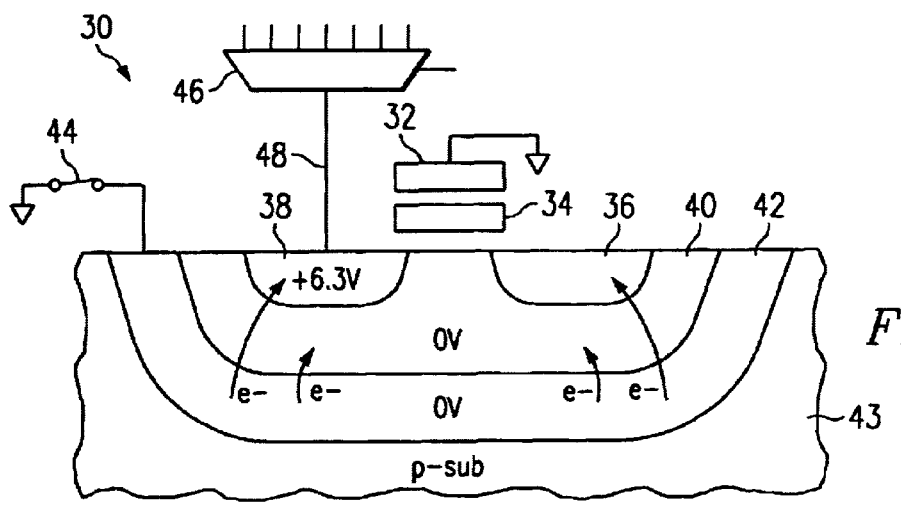
FIG. 4A is a schematic cross-sectional diagram showing the flow of electrons that results when the memory cell of FIG. 2A is discharged in accordance with an alternative method of the present invention.

FIG. 4A is a schematic cross-sectional diagram showing the flow of electrons that results when the memory cell of FIG. 2A is discharged in accordance with an alternative embodiment of the present invention. In the embodiment of FIG. 4A, switch 44 is connected to well region 42. After erase operation, the voltage levels of the components of memory cell 30 are as shown in FIG. 2A. In the embodiment shown in FIG. 4A, closing switch 44 electrically connects well region 42 to ground. As a result, the voltage level on tank region 40 and the voltage level on well region 42 decrease to 0.7 volts and zero volts, respectively. The flow of electrons from well region 42 to tank region 40, drain region 38, and source region 36 decreases the voltage level of drain region 38, thereby eliminating the charge that remained on bit line 48 as a result of the erase operation.

Figure 4B:
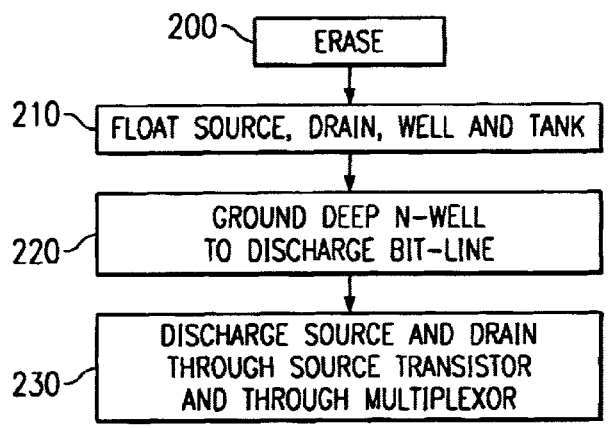
FIG. 4B is a flow chart showing steps involved in discharging the memory cell of FIG. 2A in accordance with the method shown in FIG. 4A.

FIG. 4B is a flow chart showing steps involved in discharging memory cell 30 in accordance with the alternative method shown in FIG. 4A. Step 200 comprises an erase operation. Erasure of memory cell 30 is accomplished in this alternative embodiment of the invention by applying a positive voltage differential across well region 42 and select gate region 32. Well region 42 and tank region are at the same potential. As discussed above, a charge remains on drain region 38, and consequently, on bit line 48 after the erase operation. Step 210 comprises floating source region 36, drain region 38, well region 42, and tank region 40. Step 220 comprises electrically connecting well region 42 to ground. Such a connection is accomplished in this embodiment by means of switch 44, which can be a transistor or other electrical switch. As shown in FIG. 4A, step 220 is accomplished by closing switch 44, which connects well region 42 to ground and causes the remaining charge on bit line 48 to discharge. If any charge remains on source region 36 or drain region 38 following step 220, such charge can be discharged through data multiplexor 46 as shown in step 230.

Figure 4C:
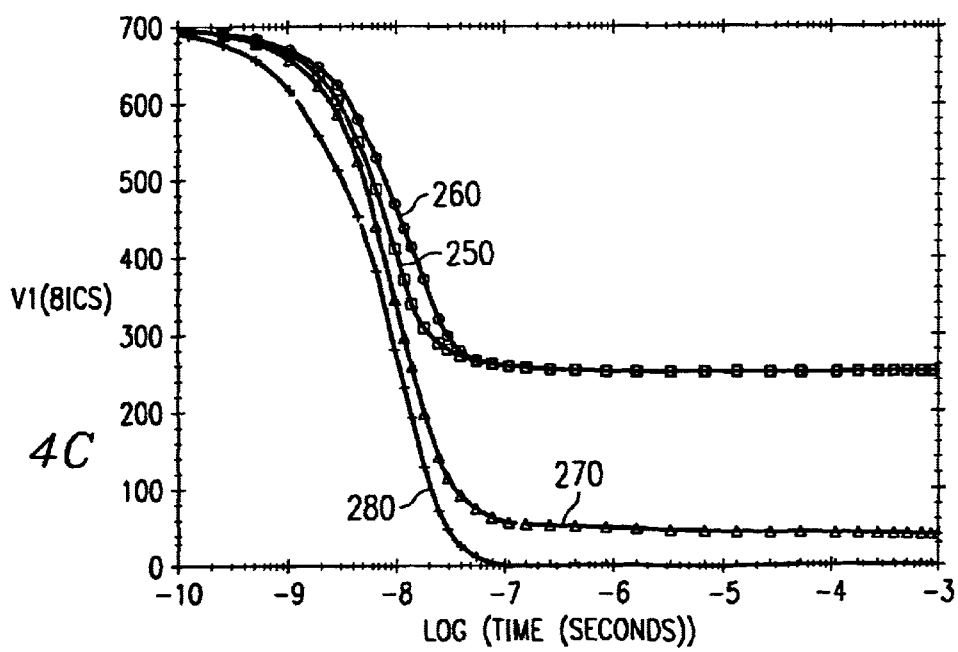
FIG. 4C is a graph showing the voltage versus time characteristics of the present invention when discharged according to the method of FIG. 4B.

FIG. 4C is a graph showing representative voltage versus time characteristics of components of memory cell 30 when discharged according to the alternative method shown in FIG. 4A and FIG. 4B. Curve 250 shows the voltage level of source region 36 during discharge, while curve 260 shows the voltage level of drain region 38. Similarly, curve 270 and curve 280 show the voltage levels of tank region 40 and well region 42 respectively. As shown by FIG. 4C and particularly curve 260, discharging memory cell 30 in accordance with this embodiment of the present invention does successfully eliminate a substantial portion of the remaining charge on drain region 38 and consequently, on bit line 48.

Figure 5A:
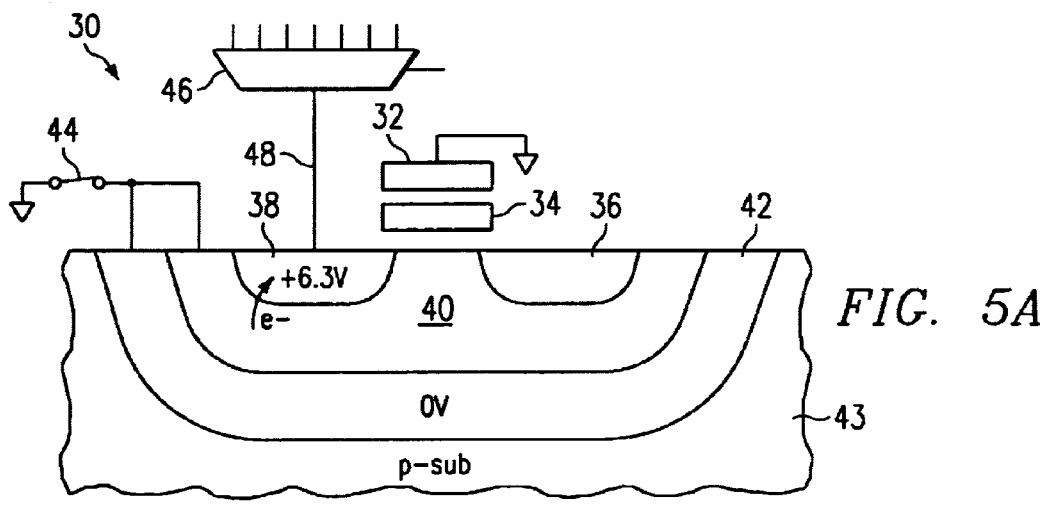
FIG. 5A is a schematic cross-sectional diagram showing the flow of electrons that results when the memory cell of FIG. 2A is discharged in accordance with a second alternative method of the present invention.

FIG. 5A is a schematic cross-sectional diagram showing the flow of electrons that results when the memory cell of FIG. 2A is discharged in accordance with an alternative method of the present invention. In the embodiment of FIG. 5A, switch 44 is connected to well region 42 and tank region 40. After erase operation, the voltage levels of the components of memory cell 30 are as shown in FIG. 2A. In the embodiment shown in FIG. 5A, closing switch 44 electrically connects well region 42 and tank region 40 to ground. As a result, the voltage level on well region 42 and tank region decreases to 0 volts. The flow of electrons from tank region 40 decreases the voltage level of drain region 38, thereby eliminating the charge that remained on bit line 48 as a result of the erase operation.

Figure 5B:
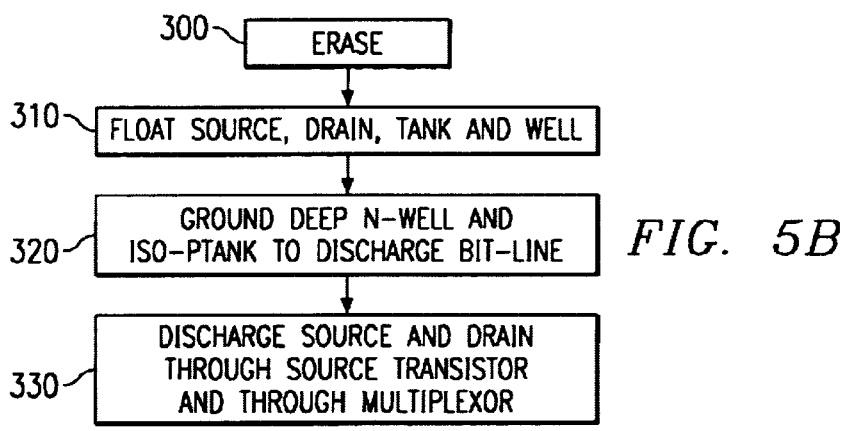
FIG. 5B is a flow chart showing steps involved in discharging the memory cell of FIG. 2A in accordance with the method shown in FIG. 5A.

FIG. 5B is a flow chart showing steps involved in discharging memory cell 30 in accordance with the alternative method shown in FIG. 5A. Step 300 comprises an erase operation. Erasure of memory cell 30 is accomplished in this alternative embodiment of the invention by applying a positive voltage differential across well region 42 and select gate region 32. The potential of well region 42 and tank region 40 are the same. As discussed above, a charge remains on drain region 38, and consequently, on bit line 48 after the erase operation. Step 310 comprises floating source region 36, drain region 38, well region 42, and tank region 40. Step 320 comprises electrically connecting well region 42 and tank region 40 to ground. Such a connection is attained in this embodiment by means of switch 44, which can be a transistor or other electrical switch. As shown in FIG. 5A, step 320 is accomplished by closing switch 44, which connects well region 42 and tank region 40 to ground and causes the remaining charge on bit line 48 to discharge. If any charge remains on source region 36 or drain region 38 following step 220, such charge can be discharged through data multiplexor 46 as shown in step 230.

Figure 5C:
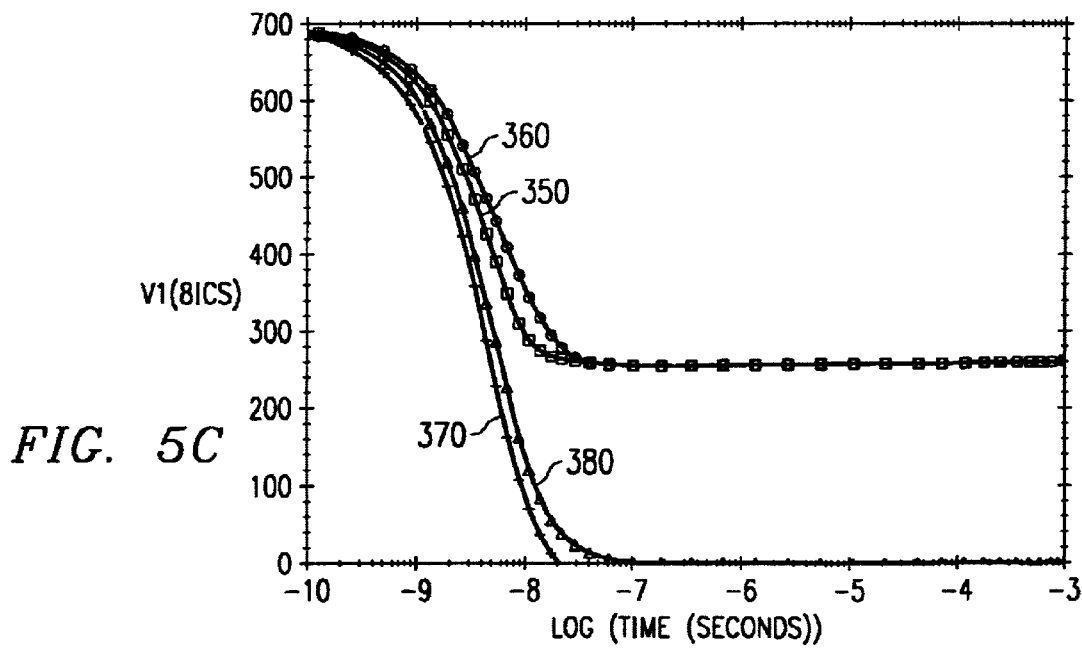
FIG. 5C is a graph showing the voltage versus time characteristics of the present invention when discharged according to the method of FIG. 5B.

FIG. 5C is a graph showing the voltage versus time characteristics of components of memory cell 30 when discharged according to the alternative method shown in FIG. 5A and FIG. 5B. Curve 350 shows the voltage level of source region 36 during discharge, while curve 360 shows the voltage level of drain region 38. Similarly, curve 370 and curve 380 show the voltage levels of tank region 40 and well region 42 respectively. As shown by FIG. 5C and particularly curve 360, discharging memory cell 30 in accordance with this embodiment of the present invention does successfully eliminate a substantial portion of the remaining charge on drain region 38 and consequently, on bit line 48.

Thus, it should be obvious to one skilled in the art that the present invention overcomes the drawbacks of the conventional method for discharging memory cell arrays. By requiring only one switch for discharging a plurality of memory cells within the memory cell array, the present invention teaches memory cells that are both smaller and less expensive to manufacture than those manufactured in accordance with the conventional method.

Although the present invention and its advantages have been described in detail, it should be understood that various changes, substitutions, and alterations can be made therein without departing form the spirit and the scope of the present invention as defined by the appended claims.

What is claimed is:
1. A method for use in erasing data stored in a memory cell, comprising:

asserting a voltage differential across a tank region and a gate region of the memory cell, wherein the tank region has a first conductivity type and the tank region is located within a well region of a second conductivity type;

floating the voltage of a source region and drain region of the memory cell, wherein the source and drain region are located within the tank region and comprise a material having the second conductivity type;

discharging a charge stored in the drain region by:
- floating the tank region;
- floating the well region;
- electrically connecting the source region to a first electric potential lower than the potential of the drain region; and
- electrically connecting the well region and the tank region to a second electric potential lower than both the existing electric potential of the well region and the existing electric potential of the tank region.

2. The method of claim 1, wherein the memory cell comprises one of a plurality of memory cells and the source regions of all of the plurality of memory cells are electrically connected together.

3. The method of claim 1, wherein the first and second electric potentials are ground.

4. The method of claim 1, wherein the drain region is not directly connected to a transistor that is operable to discharge the drain region.

5. The method of claim 1, wherein the first conductivity type is a p-type conductivity type and the second conductivity type is an n-type conductivity type.

6. The method of claim 1, wherein a transistor connects the source region to the first electric potential.

7. A method for use in erasing the data stored in a memory cell, comprising:

asserting a voltage differential across a tank region and a gate region of the memory cell, wherein the tank region comprises a material having a first conductivity type and is located within a well region comprising a material of a second conductivity type;

floating the voltage of both a source and drain region of the cell, wherein the source and drain region comprise a material of the second conductivity type and the source and drain region are located within the tank region; and discharging a charge stored in the drain region by electrically connecting the well region to an electric potential lower than the potential of the drain region.

8. The method of claim 7, and further comprising electrically connecting the source region and drain region to ground.

9. The method of claim 7, wherein the memory cell comprises one of a plurality of memory cells and the source regions of all of the plurality of memory cells are electrically connected together.

10. The method of claim 7, wherein discharging a charge stored in the drain region comprises electrically connecting the well region and the tank region to an electric potential lower than the potential of the drain region.

11. The method of claim 7, wherein the drain region is not directly connected to a transistor operable to discharge the drain region.

12. The method of claim 7, wherein the first conductivity type is a p-type conductivity type and the second conductivity type is an n-type conductivity type.

13. The method of claim 7, wherein a transistor connects the source region to the lower potential.

* * * * *